United States Patent [19]

Murayama

[11] Patent Number: 5,736,780
[45] Date of Patent: Apr. 7, 1998

[54] SEMICONDUCTOR DEVICE HAVING CIRCUIT PATTERN ALONG OUTER PERIPHERY OF SEALING RESIN AND RELATED PROCESSES

[75] Inventor: Kei Murayama, Nagano, Japan

[73] Assignee: Shinko Electric Industries Co., Ltd., Nagano, Japan

[21] Appl. No.: 744,994

[22] Filed: Nov. 7, 1996

[30] Foreign Application Priority Data

Nov. 7, 1995 [JP] Japan ................. 7-288284

[51] Int. Cl.⁶ .................... H01L 23/12; H01L 23/31
[52] U.S. Cl. .................. 257/673; 257/683; 257/689; 257/692; 257/693; 257/696; 257/698; 257/700; 257/709; 257/737; 257/738; 257/787; 361/767; 438/125
[58] Field of Search ................. 257/678, 673, 257/680, 683, 687, 692, 693, 696, 698, 700–703, 709, 735–738, 668, 787, 788, 789, 780, 778; 438/125; 361/767

[56] References Cited

U.S. PATENT DOCUMENTS

| | | | |
|---|---|---|---|
| 4,849,857 | 7/1989 | Butt et al. | 257/668 |
| 4,855,867 | 8/1989 | Gazdik et al. | 257/712 |
| 5,349,501 | 9/1994 | Kawakami | 257/692 |
| 5,357,400 | 10/1994 | Takekawa | 257/668 |
| 5,365,107 | 11/1994 | Kuraishi et al. | 257/673 |
| 5,438,224 | 8/1995 | Papageorge et al. | 257/787 |
| 5,448,106 | 9/1995 | Fujitsu | 257/668 |
| 5,450,283 | 9/1995 | Lin et al. | 257/706 |
| 5,506,756 | 4/1996 | Haley | 257/693 |
| 5,608,262 | 3/1997 | Degani et al. | 257/723 |
| 5,672,908 | 9/1997 | Fujitsu | 257/790 |

FOREIGN PATENT DOCUMENTS 3235493  3/1984  Germany ................. 257/678

*Primary Examiner*—Tom Thomas
*Assistant Examiner*—Alexander Oscar Williams
*Attorney, Agent, or Firm*—Staas & Halsey

[57] ABSTRACT

A flexible circuit board includes an insulating flexible film having a lower surface provided with first wiring patterns having first inner ends, and second outer ends extending to a peripheral area of the insulating flexible film. A semiconductor element is electrically connected to and supported by the first inner ends of the first patterns. A connecting circuit board includes an insulating base substrate having an upper surface provided with second wiring patterns having first inner ends, and second outer ends extending to a peripheral area of the base substrate, and a lower surface provided with external connecting terminals electrically connected to the first inner ends of the second wiring patterns by vias. A resin fills a space between the lower surface of the flexible circuit board and the upper surface of the connecting circuit board so that the semiconductor element is hermetically sealed with the resin. The second outer ends of the first and second patterns are electrically connected to each other, so that the semiconductor element is electrically connected to the external connecting terminals.

20 Claims, 5 Drawing Sheets

SEMICONDUCTOR DEVICE HAVING CIRCUIT PATTERN ALONG OUTER PERIPHERY OF SEALING RESIN AND RELATED PROCESSES

BACKGROUND OF THE INVENTION

1. Field of the Invention

The present invention relates to semiconductor devices and a process for producing the same, particularly to those having external connection terminals arranged in a matrix manner and a process for producing the same.

2. Description of the Related Art

There are various configurations of semiconductor devices, and PPGA (plastic pin grid array) or BGA (ball grid array) types have recently been developed. External connection terminals are arranged in matrix manner on a mounting surface of these semiconductor packages. Such products are advantageous in that the mounting density thereof can be increased in comparison with QFP (quad flat package) or the like wherein lead pins extend out of the lateral sides of the package. Particularly, PPGA has a further advantage in the production cost compared to other PGA type semiconductor packages made of ceramic.

A BGA type semiconductor device is known, wherein the external connection terminals are arranged in a matrix manner on a mounting surface thereof. In this semiconductor device, a semiconductor chip is sealed on one surface of a substrate with a resin and solder balls are provided on the other surface of the substrate as the external connection terminals. The semiconductor chip is electrically connected to the external connection terminals via circuit patterns.

In this regard, semiconductor devices such as the PPGA type or the BGA type have problems in that the production process thereof becomes complicated because the plastic substrate must be bonded to the semiconductor chip and/or one surface of the package must be resin-molded, and the semiconductor element cannot be tested and rejected, if necessary, prior to being mounted to the substrate constituting the package. Such a test can be carried out in the prior art only after the wire-bonding process which is almost the final step of the production. Also, if there is a difference in a thermal expansion coefficient between the package substrate and a substrate on which the package is to be mounted (hereinafter referred to as a "main substrate"), the thermal stress, which is created between the semiconductor device and the main substrate after the former is mounted on the main substrate, may reduce the reliability of the semiconductor.

SUMMARY OF THE INVENTION

Accordingly, an object of the present invention is to provide a semiconductor device capable of being easily produced, in which the semiconductor element can be tested and rejected, unless it is allowable, prior to reaching the final product.

Another object of the present invention is to provide a semiconductor device in which the thermal stress which might be created between the semiconductor device and the main substrate can be minimized to enhance the reliability of the product thereof. Also, a process for producing such a semiconductor device is provided.

Still another object of the present invention is to provide a semiconductor device in which the above problems can be eliminated.

According to the present invention, there is provided a semiconductor device comprising: a flexible circuit board with an insulating flexible film having a surface provided with first wiring patterns having first inner and second outer ends, the second ends extending to a peripheral area of said insulating flexible film; a semiconductor element electrically connected to and supported by said first ends of the first patterns; a connecting circuit board with an insulating base substrate having a first surface provided with second wiring patterns having first inner and second outer ends, the second ends extending to a peripheral area of said base substrate, and a second surface provided with external connecting terminals electrically connected to said first ends of the second wiring patterns by vias; a resin filled in a space between said first surfaces of the flexible circuit board and said connecting circuit board so that said semiconductor element is hermetically sealed with said resin; and said second ends of said first patterns and said second ends of said second patterns are electrically connected to each other, so that said semiconductor element is electrically connected to said external connecting terminals.

In one embodiment, said insulating flexible film has a device hole, at which said semiconductor element is located, and said first ends of the first wiring patterns extend to an inside of said device hole.

In another embodiment, said insulating base substrate of the connecting circuit board also includes a flexible film.

In still another embodiment, said insulating base substrate of the connecting circuit board also includes a non-flexible substrate.

In still further embodiment, said second ends of said first patterns and said second ends of said second patterns are electrically connected to each other by an anisotropic electro-conductive adhesive.

According to another aspect of the present invention, there is provided a process for producing a semiconductor device, including the steps of: preparing a flexible circuit board with an insulating flexible film having a device hole and a first surface provided with first wiring patterns having first inner ends extending to an inside of said device hole and second outer ends extending to a peripheral area of said insulating flexible film, and a connecting circuit board with an insulating base substrate having a first surface provided with second wiring patterns having first inner and second outer ends, the second ends extending to a peripheral area of said base substrate, and a second surface provided with external connecting terminals electrically connected to said first ends of the second wiring patterns by vias; electrically connecting a semiconductor element to said first ends of the first patterns, in such a manner that said semiconductor element is located within said device hole; arranging said flexible circuit board and said connecting circuit board so that said first surfaces of the flexible circuit board and said connecting circuit board face each other; electrically connecting said second ends of said first patterns and said second ends of said second patterns to each other, so that said semiconductor element is electrically connected to said external connecting terminals; and filling a space between said first surfaces of the flexible circuit board and said connecting circuit board with resin to hermetically seal said semiconductor element with said resin.

According to still another aspect of the present invention, there is provided a process for producing a semiconductor device including the steps of: preparing a flexible circuit board with an insulating flexible film having a device hole and a first surface provided with first wiring patterns having first inner ends extending to an inside of said device hole and second outer ends extending to a peripheral area of said insulating flexible film, and a connecting circuit board with an insulating base substrate having a first surface provided with second wiring patterns having first inner and second outer ends, the second ends extending to a peripheral area of said base substrate, and a second surface provided with external connecting terminals electrically connected to said first ends of the second wiring patterns by vias; electrically connecting a semiconductor element to said first ends of the first patterns, in such a manner that said semiconductor element is located within said device hole; arranging said flexible circuit board and said connecting circuit board so that said first surfaces of the flexible circuit board and said connecting circuit board face to each other; electrically connecting said second ends of said first patterns and said second ends of said second patterns to each other, so that said semiconductor element is electrically connected to said external connecting terminals; and filling a space between said first surfaces of the flexible circuit board and said connecting circuit board with resin to hermetically seal said semiconductor element with said resin.

DETAILED DESCRIPTION OF THE EMBODIMENTS

The present invention will be described in more detail with reference to the preferred embodiments illustrated in the attached drawings.

A semiconductor device according to the present invention is constituted by a flexible circuit board for carrying a semiconductor element and a connection circuit board for carrying external connection terminals. First and second circuit patterns are provided on the flexible circuit board and on the connection circuit board, respectively. The first circuit patterns of the flexible circuit board are electrically connected to a semiconductor element, and the second circuit patterns of the connection circuit board are electrically connected to the external connection terminals.

Figure 1A:
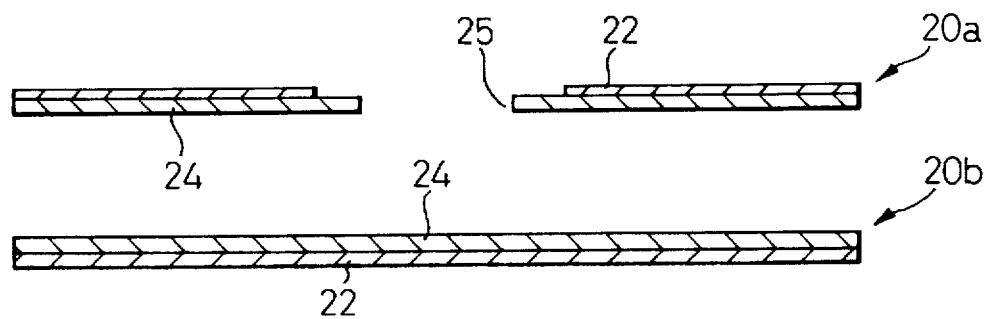
FIGS. 1(a) through 1(c) are illustrations for explaining the production steps of a semiconductor device according to a first embodiment of the present invention.
Figure 1B:
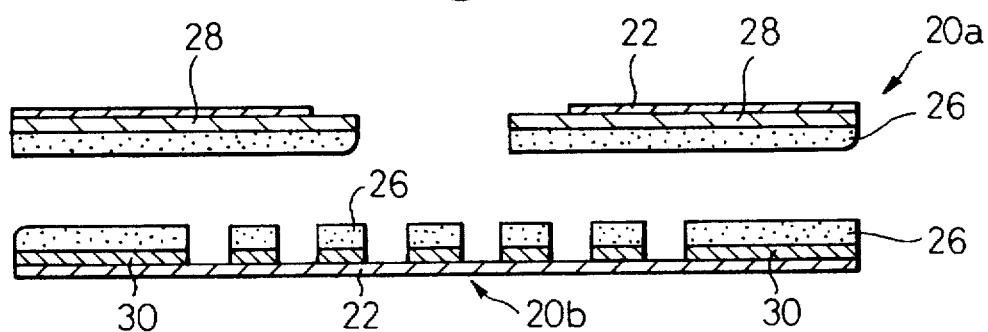
Figure 1C:
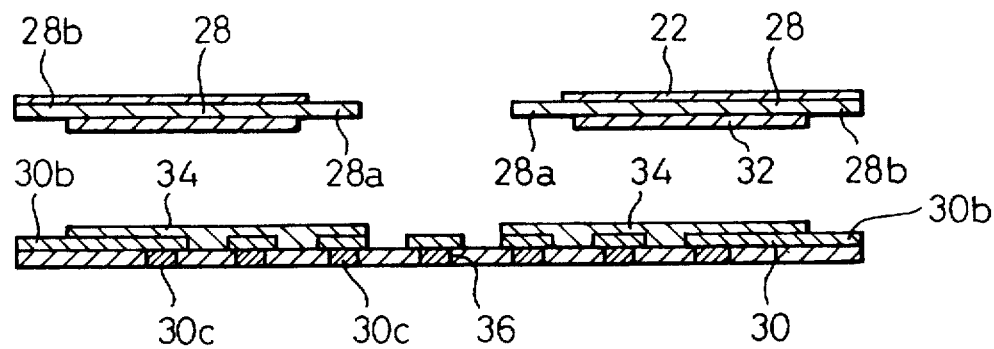

FIGS. 1(a) to 1(c) illustrate a process for producing the semiconductor device according to a first embodiment of the present invention.

FIGS. 1(a) shows a pair of copper-foiled films 20a, 20b for forming the flexible circuit board for carrying the semiconductor element and the connection circuit board, respectively. Desired circuit patterns are formed on the copper-foiled films 20a, 20b, respectively, by individual processes. In this drawing, for the purpose of clarifying the positional relationship, the copper-foiled film 20a for forming the flexible circuit board is shown on the upper side, while the copper-foiled film 20b for forming the connection circuit board is on the lower side.

The copper-foiled film 20a or 20b includes of an insulating film 22 such as a polyimide film, one surface of which is covered with a copper foil 24 as a conductive layer. An opening 25 is provided in the copper-foiled film 20 at a position where the semiconductor element is to be located.

FIG. 1(b) illustrates the steps for forming the first and second circuit patterns in the copper-foiled films 20a and 20b, respectively. A resist is coated on the surface of each the copper-foiled films 20a, 20b, then exposed and developed to form a resist pattern 26. Thereafter, the copper foil 24 is etched while using the resist pattern 26 as a mask, whereby first wiring or circuit patterns 28 and second wiring or circuit patterns 30 are provided on the insulating films 22, respectively.

FIG. 1(c) shows the flexible circuit board and the connection circuit board both carrying the predetermined circuit patterns thereon. The semiconductor element is mounted on the flexible circuit board so that first inner ends 28a of the first circuit patterns 28 of the copper-foiled film 20a forming the flexible circuit board are connected to the semiconductor element. Second outer ends 28b of the first circuit patterns 28 are connected to the second circuit patterns 30. Vias 30c which are to be connected with the external connection terminals are formed at first inner ends of the second circuit patterns 30 provided in the copper-foiled film 20b used as the connection circuit board. Second outer, ends 30b of the second circuit pattern 30 are connected to the second ends 28b of the first circuit pattern 28 in the flexible circuit board.

The first ends 28a of the first circuit patterns 28 extend inward of the opening 25 in accordance with the arrangement of electrodes of the semiconductor element, while other ends 28b of the first circuit patterns 28 extend to the outer peripheral edge of the flexible circuit board. In FIG. 1(c), the resist patterns 26 are dissolved and removed and the surfaces of the first and second circuit patterns 28, 30 are covered with protection coatings 32, 34, such a solder resist. The protection coating 32 covers all over the patterns 28 except for the first ends 28a and the second ends 28b thereof.

In the connection circuit board to be connected with the external connection terminals, similar to the second ends 28b provided in the flexible circuit board, the second ends 30b of the second circuit pattern 30 are provided at the outer peripheral edge of the substrate, and the vias 30c which are to be connected to the external connection terminals are formed in connection with first ends of the second circuit patterns 30. Since the external connection terminals are arranged in a matrix pattern, the vias 30c are also arranged in accordance with this planar arrangement pattern of the external connection terminals.

Figure 2:
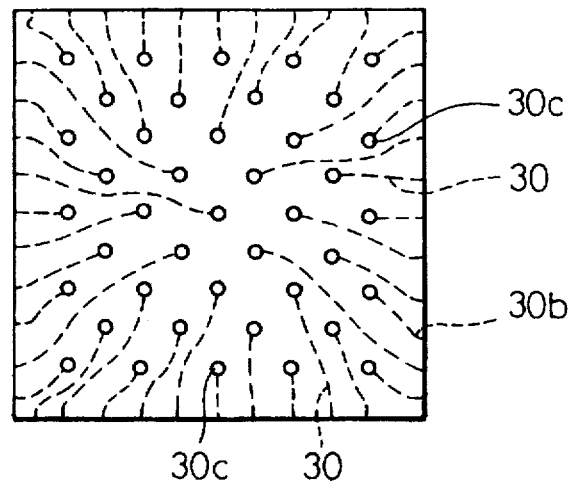
FIG. 2 is a plan view of one example of the arrangement of circuit patterns in the connection circuit board.

FIG. 2 illustrates one example of the planar arrangement of the circuit patterns 30 and the vias 30c which are to be provided in the connection circuit board. The vias 30c are arranged in a matrix manner and each is connected with the first inner end of the second circuit patterns 30, while the second ends thereof extend to the outer peripheral edge of the circuit board. The second end 30b of the second circuit pattern 30 formed on the outer peripheral edge of the circuit board is connected to the second end 28b of the first circuit pattern 28 provided in the flexible circuit board as described before.

In the connection circuit board, the external connection terminals are connected to the vias 30c. The vias 30c are formed by providing connection holes 36 in the insulating film 22 of the copper-foiled film 20b by an etching process at positions corresponding to the via 30c, then by depositing a metal (copper) on the inner walls of the connection holes 36 by an additive plating process while using the second circuit pattern 30 as a power supply layer.

After thus forming the vias 30c, the external connection terminals are connected thereto. Thus, the second circuit patterns 30 are formed on a first surface of the connection circuit board and the external connection terminal is connected to the other surface of the vias 30c.

In this regard, the external connection terminals may be formed on the connection circuit board either prior to or after the connection of the flexible circuit board with the connection circuit board. According to one of the methods for preforming the external connection terminals 14, the through holes are plated with Ni (such as shown by reference numeral 37 in FIG. 3) by an additive process and bumps which are to be the external connection terminals are simultaneously formed. The surfaces of the bumps are usually plated with gold.

Figure 3:
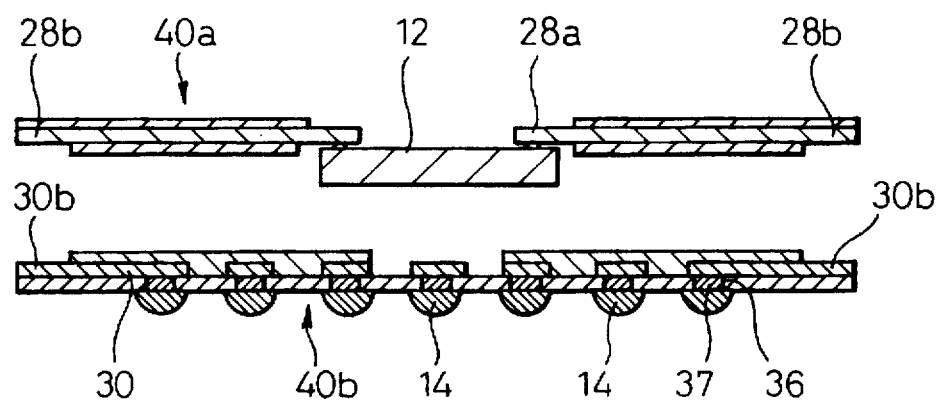
FIG. 3 is a side sectional view illustrating a state in which a semiconductor element is connected to a flexible circuit board and external connection terminals are connected to a connection circuit board.

FIG. 3 shows a state in which solder balls used as the external connection terminals 14 are mounted to the connection circuit board 40b formed in the above-mentioned manner. The external connection terminals 14 are arranged on the second surface of the connection circuit board 40b in a matrix manner.

FIG. 3 also shows a state in which the semiconductor element 12 is mounted onto the flexible circuit board 40a. The semiconductor element 12 can be connected to the first ends 28a of the circuit patterns 28 extending inward into the opening by a process similar to a simultaneous bonding process using a TAB (tape automated bonding) tape. In this state, a test such as an electric conductive test of the semiconductor element 12 can be conducted.

Figure 4:
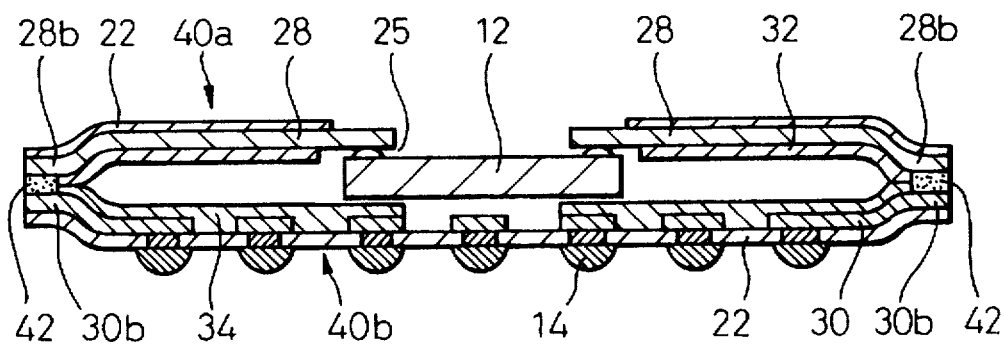
FIG. 4 is a side sectional view illustrating a state in which the flexible circuit board is bonded to the connection circuit board.

After bonding the semiconductor element 12 with the first ends 28a of the first circuit patterns 28 in the flexible circuit board 40a, and bonding the external connection terminals 14 to first ends of the second circuit patterns 30 in the connection circuit board 40b, the second ends 28b of the first circuit patterns 28 in the flexible circuit board 40a are bonded to the second ends 30b of the second circuit patterns 30 in the connection circuit board 40b. This bonding operation is carried out in such a manner, as shown in FIG. 4, that the semiconductor element 12 is located opposite to the connection circuit board 40b; the first circuit patterns 28 are located opposite to the second circuit patterns 30; and the second ends 28b of the first circuit patterns 28 are aligned with the second ends 30b of the second circuit patterns 30. Along the outer peripheral edges of the flexible circuit board 40a and the connection circuit board 40b, the second ends 28b of the first circuit patterns 28 and those 30b of the second circuit patterns 30 are sealingly bonded together while being electrically connected with each other.

The electrical connection of the second ends 28b of the first circuit patterns 28 with those 30b of the second circuit patterns 30 can be carried out via an anisotropic electro-conductive adhesive 42. The anisotropic electro-conductive adhesive 42 can bond the second ends 28b of the first circuit patterns 28 with those 30b of the second circuit patterns 30 in an electrically conductive manner, both of which are in press-contact with each other, while other portions which are not in press-contact with each other are bonded in an electrically insulated manner.

In the above-mentioned manner, the second ends 28b of the first circuit patterns 28 and those 30b of the second circuit patterns 30 corresponding thereto can be electrically connected with each other simultaneously with the firm bonding of the outer peripheral edges of the flexible circuit board 40a and the connection circuit board 40b. In this regard, alternative to the anisotropic electro-conductive adhesive 42, a gold plating may be preliminarily applied to the second ends 28b of the first circuit patterns 28 and those 30b of the second circuit patterns 30 and, after both the other ends 28b, 30b have been aligned with each second, may be press-heated and bonded together. In such a case, if the outer peripheral edge of the flexible circuit board must be bonded as a whole, an adhesive may be coated on the outer peripheral edge of the circuit board after the heat-contact bonding.

Figure 5:
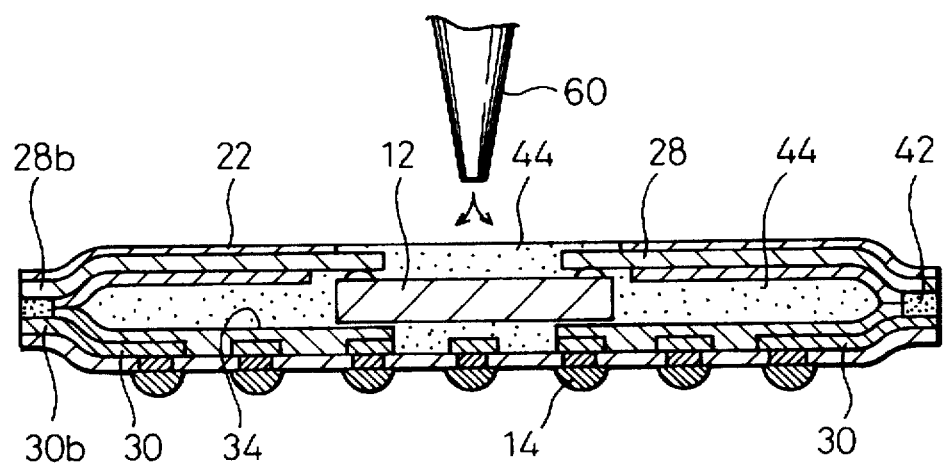
FIG. 5 is a side sectional view illustrating a state in which a resinous material is injected into the interior of the package to seal the semiconductor element.

As shown in FIG. 4, since the semiconductor element 12 is not sealed in the state in which the flexible circuit board 40a has been bonded to the connection circuit board 40b, a resinous material 44 is injected by a nozzle 60 into a gap between the flexible circuit board 40a and the connection circuit board 40b through the opening 25 in the flexible circuit board 40a to fill the interior of the package with the resinous material 44 so that the semiconductor element 12 is sealed therein as shown in FIG. 5. The resinous material 44 is also coated on the upper side of the semiconductor element 12 so that the semiconductor element 12 is completely sealed. The resinous material 44 has a function for not only sealing the semiconductor element 12 but also ensuring the retention of package shape and preventing a short-circuit from occurring between the first and second circuit patterns 28 and 30.

As the resinous materials 44 to be injected into the interior of the package, those having a proper elasticity are favorable, such as elastomers, and, during the injection, the viscosity of the resinous material 44 is adjusted to be easily introduced from the opening 25, and cured by heat after the injection so that a semiconductor device having a predetermined configuration is obtainable. The resultant semiconductor device is one in which the semiconductor element is sealingly accommodated in the interior and the outer surface is protected by an insulating film. The external connection terminals 14 are arranged in a matrix manner on the outside surface of the semiconductor device, which surface is to be mounted to the main substrate, and conductive to the semiconductor element 12 via the electric connection between the second ends 28b, 30b of the first and second circuit patterns 28, 30, respectively, on the outer peripheral edge of the semiconductor device.

Since the elastomer is used as the resinous material 44 for sealing the semiconductor element 12, it is possible to impart the semiconductor device with a predetermined softness so that a thermal stress can be absorbed on the semiconductor device side, which stress might be created due to the difference, if any, in the thermal expansion coefficient between the main substrate and the semiconductor device when the latter is mounted onto the former. Thus the problem due to the thermal stress can be eliminated when the semiconductor device is mounted on the main substrate.

According to the above first embodiment, while the resinous material 44 is injected from the opening 25 in the flexible circuit board 40a carrying the semiconductor element 12 thereon, after the flexible circuit board 40a is bonded to the connection circuit board 40b, it is also possible to precoat the resinous material 44 such as an elastomer on the opposite surfaces of the flexible circuit board 40a and the connection circuit board 40b prior to the boards being bonded with each other. In this regard, the resinous material 44 may be coated on at least one of the flexible circuit board 40a and the connection circuit board 40b. In the embodiment shown in FIG. 5, a protection coating 34 may, of course, extend to a portion corresponding to the semiconductor element 12.

Figure 6:
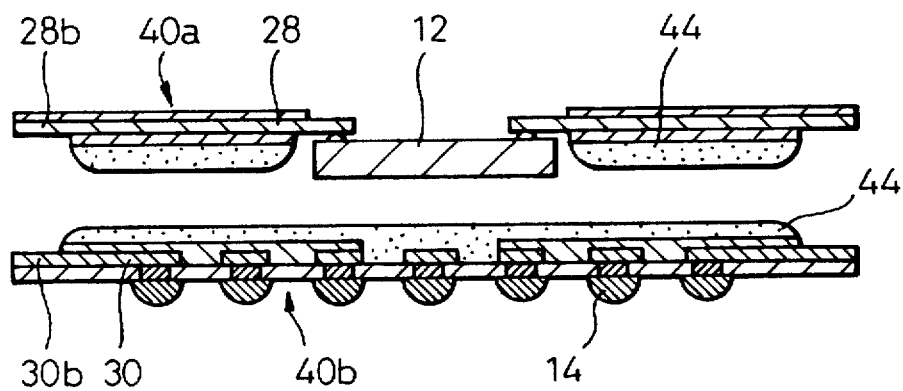
FIG. 6 is a side sectional view illustrating a state in which the resinous material is precoated on the flexible circuit board.

FIG. 6 shows a state in which the resinous material 44 is coated on the flexible circuit board 40a and the connection circuit board 40b, respectively. Since the flexible circuit board 40a carries the semiconductor element 12 thereon, the resinous material 44 is preferably coated onto the flexible circuit board 40a as a layer having a thickness similar to that of the semiconductor element 12. The resinous material 44 must not be coated onto the connection circuit board 40b but the precoating thereof is favorable because the seal of the semiconductor element is enhanced.

The bonding between the flexible circuit board 40a and the connection circuit board 40b by the precoating of the resinous material 44 thereon may also be carried out in the same manner as described in connection with the above embodiment in which the second ends 28b, 30b of the first and second circuit patterns 28, 30 in the flexible circuit board 40a and the connection circuit board 40b, respectively, are bonded with each other by the anisotropic electro-conductive adhesive. After bonding the flexible circuit board 40a with the connection circuit board 40b, the resinous material 44 is injected from the opening 25 of the flexible circuit board 40a to seal the semiconductor element 12.

As stated above, the flexible circuit board 40a having the opening 25 is advantageous because the semiconductor element 12 can be connected to the first ends 28a of the first circuit patterns 28 by a TAB method and easily and assuredly sealed, including the surface thereof on which the electrodes are provided, by the resinous material 44 injected through the opening.

Also, when the electrode surface of the semiconductor element 12 is sealed, it is possible to use a resin having a high curability which has been favorably used in a potting process for sealing the semiconductor element.

Figure 7A:
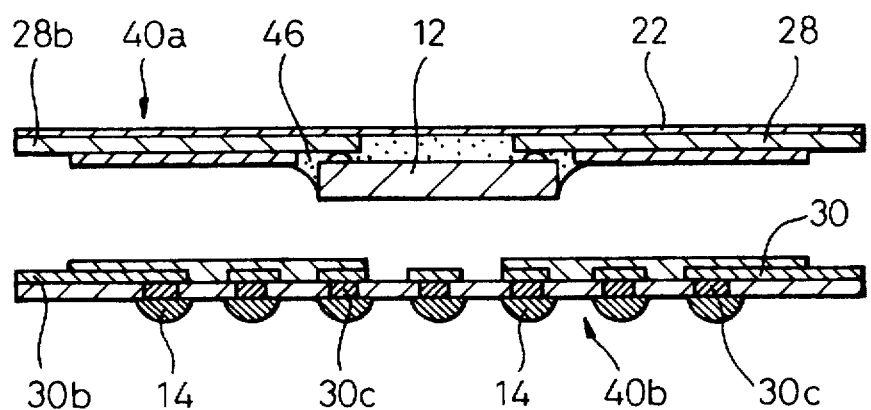
FIGS. 7(a) and 7(b) are illustrations for explaining the production steps of a semiconductor device according to a second embodiment of the present invention.
Figure 7B:
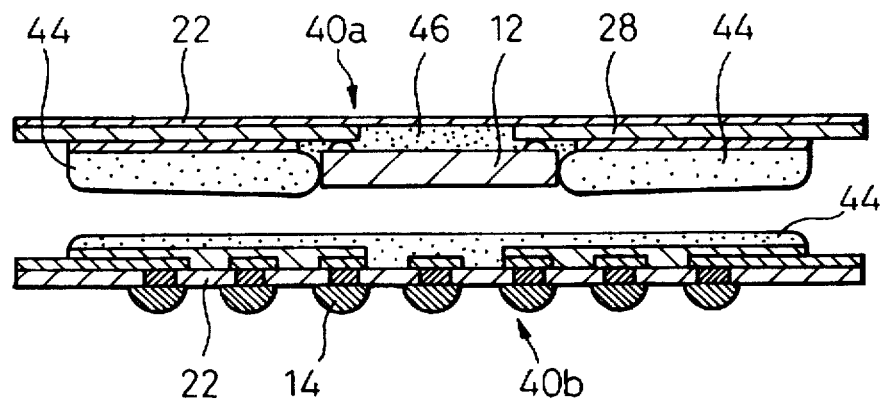
Figure 8:
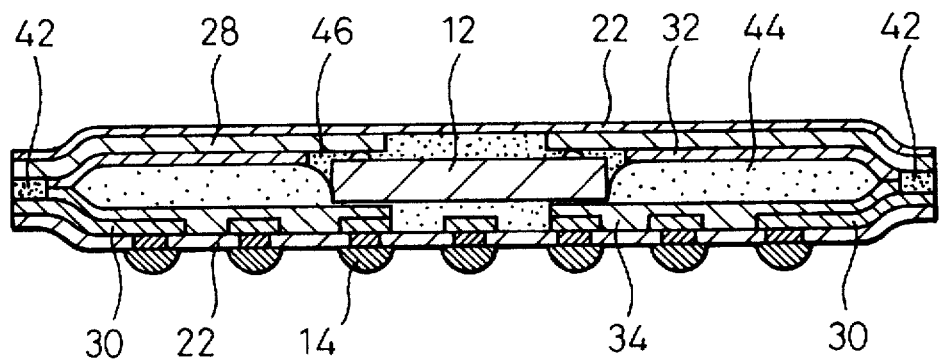
FIG. 8 is a side sectional view of the semiconductor device according to the second embodiment.

FIGS. 7(a), 7(b) and 8 illustrate a second embodiment in which the flexible circuit board 40a for carrying the semiconductor element 12 has no opening 25. Also, in this case, the first circuit patterns 28 and the second circuit patterns 30 are formed by etching the copper foils carried on the copper-foiled films, respectively.

FIG. 7(a) shows a state in which the semiconductor element 12 is mounted onto the flexible circuit board 40a, and the external connection terminals 14 are bonded to one end of the second circuit patterns 30 in the connection circuit board 40b through the via 30c. The semiconductor element 12 is connected to the first ends of the first circuit patterns 28 by a flip-chip bonding process, while a protection resin 46 is injected into a gap between the electrode surface of the semiconductor element 12 and the flexible circuit board 12 so that the electrode surface of the semiconductor element 40a is sealed.

FIG. 7(b) shows a state in which the resinous material 44 such as an elastomer is precoated on the surfaces of the flexible circuit board 40a and the connection circuit board 40b positioned opposite to each other to bond both circuit boards with each other. Since the resinous material 44 cannot be injected into the package during the post process when the flexible circuit board 40a having no opening 25 is used, it is necessary to select a thickness of the coated resinous material 44 so that the semiconductor element 12 is completely sealed thereby when the flexible circuit board 40a and the connection circuit board 40b are bonded together.

FIG. 8 shows a state in which a semiconductor device is completed by bonding the flexible circuit board 40a and the connection circuit board 40b together. Similar to the preceding embodiment, the second ends 28b of the first circuit patterns 28 in the flexible circuit board 40a are electrically connected to the second ends 30b of the second circuit patterns 30 in the connection circuit board 40b on the outer peripheral edges of both the circuit boards by the anisotropic electro-conductive adhesive 42 or the like.

The whole circumference of the semiconductor device, including a portion on which the semiconductor element 12 is mounted, according to this embodiment is covered with an insulating film. Protection coatings 32, 34 can be formed in the same manner as the embodiment shown in FIG. 4.

Figure 9:
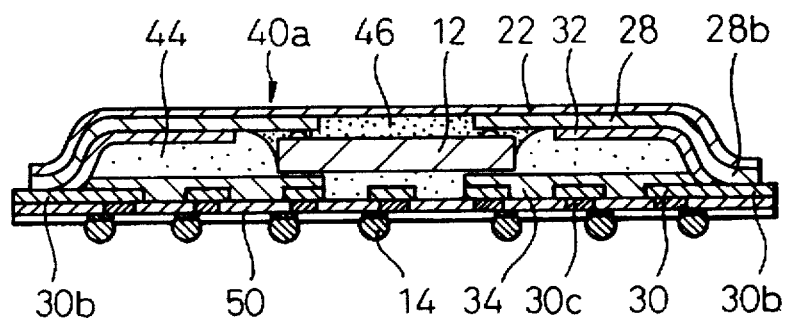
FIG. 9 is a side sectional view of a semiconductor device according to a third embodiment.

FIG. 9 shows a third embodiment of the present invention in which a printed circuit board 50 which substrate is made of glass/epoxy, glass/polyimide or BT resin is used as the connection circuit board for carrying the external connection terminals 14. On one surface of the printed circuit board 50 to be bonded with the flexible circuit board 40a, the second circuit patterns 30 are provided. A first end of the second circuit pattern 30 is connected through the via 30c to the external connection terminal 14 provided on the other surface of the printed circuit board 50. The second end 30b of the second circuit pattern 30 extends outward from the outer peripheral edge of the printed circuit board 50.

The via 30c is formed by providing a through-hole in the printed circuit board 50 and depositing a conductive metal on the inner wall thereof by through-hole plating. In this case, if it is desired to provide circuit patterns on the other surface of the printed circuit board 50 for connecting lands and the through-holes, all of the other surface of the printed circuit board 50 should be covered with a solder resist, except for portions in which the lands are provided.

The flexible circuit board 40a for carrying the semiconductor element 12 has the same structure as the preceding embodiment in which the opening 25 for mounting the semiconductor element 12 may be either present or not. FIG. 9 shows an embodiment in which no opening 25 is provided in the flexible circuit board 40a. When the semiconductor device is assembled, the semiconductor element 12 is mounted onto the flexible circuit board 40a, and after coating the resinous material 44 such as an elastomer to a predetermined thickness on the surface of the flexible circuit board 40a to which the semiconductor element 12 is bonded, the flexible circuit board 40a and the printed circuit board 50 are disposed so that the surface of the flexible circuit board 40a carrying the first circuit patterns 28 and the surface of the printed circuit board 50 carrying the second circuit patterns 30 are opposite to each other. Then, the second ends 28b of the first circuit patterns 28 provided in the flexible circuit board 40a are aligned and bonded to the second ends 30b of the second circuit patterns 30 provided in the printed circuit board 50.

The bonding between the second ends 28b of the first circuit patterns 28 and the second ends 30b of the second circuit pattern 30 may be carried out by the use of the anisotropic electro-conductive adhesive 42 as described before, but in this embodiment, gold is preliminarily plated on the surfaces of the second ends 28b of the first circuit patterns 28 and the second ends 30b of the second circuit pattern 30, then both the ends are connected by a contact bonding process. Also, when the flexible circuit board 40a is bonded to the printed circuit board 50, the resinous material 44 may be precoated on the surface of the printed circuit board 50 on which the flexible circuit board 40a is to be bonded.

The semiconductor device according to this embodiment has an advantage in that the shape retention is improved because the device is constituted by the flexible circuit board 40a and the printed circuit board 50 in which the printed circuit board 50 functions as a structural member, i.e., a non-flexible board.

In this regard, to improve the shape retention of the package when the semiconductor device is constituted by the flexible circuit board 40a and the connection circuit board 40b as in the aforesaid embodiments, a frame made of a metal or a resin may be inserted between the flexible circuit board 40a and the connection circuit board 40b.

Also, in the above embodiment, while the first circuit patterns 28 and the second circuit patterns 30 are bonded together along four edges of the flexible circuit board 40a and the connection circuit board 40b, the connection of both the circuit boards is not limited to such a manner. For example, the first and second circuit patterns 28 and 30 may be provided on two corresponding edges of the flexible circuit board 40a and the connection circuit board 40b, respectively.

Figure 10:
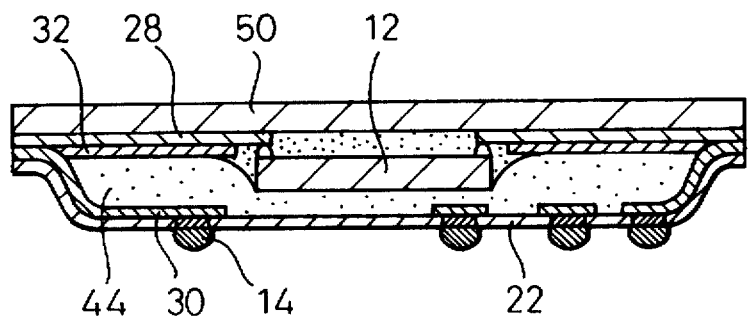
FIG. 10 is a side sectional view of the semiconductor device according to a fourth embodiment.

FIG. 10 is a side sectional view of a semiconductor device according to a fourth embodiment of this invention. This embodiment is similar to the embodiment shown in FIGS. 7(a), 7(b) and 8 except that a hard printed circuit board 50 is used in place of the flexible circuit board 40a. The semiconductor element 12 is mounted on the printed circuit board 50.

The structure of the semiconductor device using the flexible circuit board and the process for producing the same have been described above. According to the inventive process, since the connection circuit board 40b is bonded to the flexible circuit board 40a after the semiconductor element 12 has been mounted to the latter, it is possible to test the semiconductor element 12 while being carried on the flexible circuit board, before the same is bonded to the connection circuit board 40b. Accordingly, the semiconductor element can be rejected, if it is not acceptable, through this test prior to being incorporated into the final product.

Also, since both the circuit boards are bonded together by injecting or precoating the resinous material 44 after the semiconductor element 12 has been mounted to the flexible circuit board, the production cost can be reduced compared with the prior art in which the resin seal is carried out by a resin sealing device.

The total thickness of the semiconductor device is substantially the same as the sum of thicknesses of the semiconductor element 12, the flexible circuit board 40a and the connection circuit board 40b. Since the flexible circuit board 40a and the connection circuit board 40b are thin, there is an advantage in that the semiconductor device can be made thinner.

In the above embodiments, solder balls are used as the external connection terminals 14 but may be replaced by lead pins or the like.

It should be understood by those skilled in the art that the foregoing description relates to only some preferred embodiments of the disclosed invention, and that various changes and modifications may be made to the invention without departing from the spirit and scope thereof.

I claim:

1. A semiconductor device, comprising:
   a flexible circuit board with an insulating flexible film having a first surface provided with first wiring patterns having first inner ends and second outer ends, the second ends extending to a peripheral area of said insulating flexible film;
   a connecting circuit board with an insulating base substrate having a first surface provided with second wiring patterns having first inner ends and second outer ends, the second ends extending to a peripheral area of said base substrate, and a second surface provided with external connecting terminals electrically connected to said first ends of the second wiring patterns by vias;
   a semiconductor element electrically connected to said first ends of the first patterns and being located between said first surfaces of the insulating flexible film and the insulating base substrate;
   a resin filling a space between said first surfaces that said semiconductor element is hermetically sealed with said resin, and
   said second ends of said first patterns and said second ends of said second patterns are electrically connected to each other, so that said semiconductor element is electrically connected to said external connecting terminals.

2. A semiconductor device as set forth in claim 1, wherein said insulating flexible film has a device hole, at which said semiconductor element is located, and said first ends of the first wiring patterns extends into said device hole.

3. A semiconductor device as set forth in claim 1, wherein said insulating base substrate of the connecting circuit board also comprises a flexible film.

4. A semiconductor device as set forth in claim 1, wherein said insulating base substrate of the connecting circuit board also comprises a non-flexible substrate.

5. A semiconductor device as set forth in claim 1, wherein said second ends of said first patterns and said second ends of said second patterns are electrically connected to each other by an anisotropic electro-conductive adhesive.

6. A process for producing a semiconductor device, comprising the steps of:
   preparing a flexible circuit board with an insulating flexible film having a device hole and a first surface provided with first wiring patterns having first inner ends extending into said device hole and second outer ends extending to a peripheral area of said insulating flexible film, and a connecting circuit board with an insulating base substrate having a first surface provided with second wiring patterns having first inner ends and second outer ends, the second ends extending to a peripheral area of said base substrate, and a second surface provided with external connecting terminals electrically connected to said first ends of the second wiring patterns by vias;
   arranging said flexible circuit board and said connecting board so that said first surfaces face each other with a space therebetween;
   electrically connecting a semiconductor element to said first ends of the first patterns, in such a manner that said semiconductor element is at said device hole in the space;
   electrically connecting said second ends of said first patterns and said second ends of said second patterns to each other, so that said semiconductor element is electrically connected to said external connecting terminals; and filing the space with resin to hermetically seal said semiconductor element with said resin.

7. A process as set forth in claim 6, wherein said second ends of said first patterns and said second ends of said second patterns are electrically connected to each other by an anisotropic electro-conductive adhesive.

8. A process as set forth in claim 6, wherein said insulating base substrate of the connecting circuit board also comprises a flexible film.

9. A process as set forth in claim 6, wherein said insulating base substrate of the connecting circuit board also comprises a non-flexible substrate.

10. A process for producing a semiconductor device, comprising the steps of:

preparing a flexible circuit board with an insulating flexible film having a device hole, and a first surface provided with first wiring patterns having first inner ends extending to an inside of said device hole and second outer ends extending to a peripheral area of said insulating flexible film, and a connecting circuit board with an insulating base substrate having a first surface provided with second wiring patterns having first inner ends and second outer ends, the second ends extending to a peripheral area of said base substrate, and a second surface provided with external connecting terminals electrically connected to said first ends of the second wiring patterns by vias;

arranging said flexible circuit board and said connecting circuit board so that said first surfaces face each other with a space therebetween;

electrically connecting a semiconductor element to said first ends of the first patterns, in such a manner that said semiconductor element is in the space;

electrically connecting said second ends of said first patterns and said second ends of said second patterns to each other, so that said semiconductor element is electrically connected to said external connecting terminals; and filling the space with resin to hermetically seal said semiconductor element with said resin.

11. A process as set forth in claim 10, wherein said second ends of said first patterns and said second ends of said second patterns are electrically connected to each other by an anisotropic electro-conductive adhesive.

12. A process as set forth in claim 10, wherein said insulating base substrate of the connecting circuit board also comprises a flexible film.

13. A process as set forth in claim 10, wherein said insulating base substrate of the connecting circuit board also comprises a non-flexible substrate.

14. A semiconductor device as set forth in claim 1, wherein said second ends of said first patterns and said second ends of said second patterns are electrically connected to each other by gold plating.

15. A process as set forth in claim 6, wherein said second ends of said first patterns and said second ends of said second patterns are electrically connected to each other by gold plating.

16. A process as set forth in claim 10, wherein said second ends of said first patterns and said second ends of said second patterns are electrically connected to each other by gold plating.

17. A semiconductor device as recited in claim 1, wherein the resin is coated on at least one of the first surfaces of the flexible circuit board and the connection circuit board.

18. A process as recited in claim 6, wherein the resin is coated on at least one of the first surfaces of the flexible circuit board and the connection circuit board.

19. A process as recited in claim 10, wherein the resin is coated on at least one of the first surfaces of the flexible circuit board and the connection circuit board.

20. A process for producing a semiconductor device, comprising the steps of:

preparing a flexible circuit board with an insulating flexible film having a first surface provided with first wiring patterns having first inner ends and second outer ends, the second ends extending to a peripheral area of said insulating flexible film, and a connecting circuit board with an insulating base substrate having a first surface provided with second wiring patterns having first inner ends and second outer ends, the second ends extending to a peripheral area of said base substrate, and a second surface provided with external connecting terminals electrically connected to said first ends of the second wiring patterns by vias;

arranging said flexible circuit board and said connecting circuit board so that said first surfaces face each other with a space therebetween;

electrically connecting a semiconductor element to said first ends of the first patterns, in such a manner that said semiconductor element is in the space;

electrically connecting said second ends of said first patterns and said second ends of said second patterns to each other, so that said semiconductor element is electrically connected to said external connecting terminals; and filing the space with resin to hermetically seal said semiconductor element with said resin.

* * * * *